(12) United States Patent
Byun (10) Patent No.: US 10,706,933 B2
(45) Date of Patent: Jul. 7, 2020

(54) SEMICONDUCTOR DEVICE

(71) Applicant: SK hynix Inc., Gyeonggi-do (KR)

(72) Inventor: Hee Jin Byun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/210,974

(22) Filed: Dec. 5, 2018

(65) Prior Publication Data

US 2019/0333583 A1     Oct. 31, 2019

(30) Foreign Application Priority Data

Apr. 27, 2018  (KR) .................... 10-2018-0048931

(51) Int. Cl.
| | | |
|---|---|---|
| *G11C 29/00* | (2006.01) | |
| *G11C 16/08* | (2006.01) | |
| *G11C 8/00* | (2006.01) | |
| *G11C 29/18* | (2006.01) | |

(52) U.S. Cl.
CPC ............... *G11C 16/08* (2013.01); *G11C 8/00* (2013.01); *G11C 29/18* (2013.01); *G11C 2029/1806* (2013.01)

(58) Field of Classification Search
CPC .......... G11C 16/08; G11C 8/00; G11C 29/18; G11C 2029/1806

USPC ........................................................ 365/201
See application file for complete search history.

(56) References Cited

U.S. PATENT DOCUMENTS

| 5,815,286 A * | 9/1998 | Matsuba ................. H04N 1/52 |
| | | 358/3.19 |
| 2004/0042334 A1* | 3/2004 | Sasaki ................... G11C 7/103 |
| | | 365/236 |
| 2006/0051083 A1* | 3/2006 | Yamamoto ........... H04N 5/2252 |
| | | 396/287 |

FOREIGN PATENT DOCUMENTS

| KR | 100458635 | 1/2005 |
| KR | 101199771 | 11/2012 |

* cited by examiner

*Primary Examiner* — Huan Hoang
(74) *Attorney, Agent, or Firm* — IP & T Group LLP (57) ABSTRACT

A semiconductor device includes a mode setting circuit configured to allocate any one of values to a mode signal based on an event signal, an address converter configured to generate a conversion address by converting at least one address based on the mode signal, and a memory circuit configured to perform an operation corresponding to the conversion address.

20 Claims, 9 Drawing Sheets

SEMICONDUCTOR DEVICE

CROSS-REFERENCE TO RELATED APPLICATION

The present application claims priority under 35 U.S.C. § 119(a) to Korean patent application number 10-2018-0048931, filed on Apr. 27, 2018, which is incorporated herein by reference in its entirety.

BACKGROUND OF THE INVENTION

Embodiments of the present disclosure relate to a semiconductor device, and more particularly to a semiconductor device for performing address conversion so as to prevent degradation of cell characteristics.

A non-volatile memory, such as a flash memory or a phase change memory, has a limited number of write operations capable of being executed in only one cell. Therefore, if only some regions of the non-volatile memory are intensively used, a total lifespan of the non-volatile memory can be reduced.

A volatile memory such as a DRAM may incur a row hammering phenomenon. The row hammering phenomenon will hereinafter be described in detail. When a specific word line is toggled between an enabled state and a disabled state due to a large number of enabled times of the specific word line, the amount of charge stored in a cell capacitor coupled to a contiguous word line is changed such that data stored in the memory cell is deteriorated. The above-mentioned operation is referred to as the row hammering phenomenon.

In the case of using a semiconductor device including at least one memory, some regions of the memory are intensively accessed such that unexpected deterioration may occur in the accessed regions. As a result, a lifespan of the semiconductor device may be reduced or unexpected malfunction may occur in the semiconductor device.

SUMMARY OF THE INVENTION

Various embodiments of the present disclosure are directed to providing a semiconductor device that substantially obviates one or more problems due to limitations and disadvantages of the conventional art.

An embodiment of the present disclosure relates to a technology for preventing an intensive access for some regions included in a semiconductor device.

In accordance with an aspect of the present disclosure, a semiconductor device includes a mode setting circuit configured to allocate any one of values to a mode signal based on an event signal, an address converter configured to generate a conversion address by converting at least one address based on the mode signal, and a memory circuit configured to perform an operation corresponding to the conversion address.

In accordance with another aspect of the present disclosure, a semiconductor device includes a mode setting circuit configured to allocate any one of values to a mode signal based on an event signal, an address converter configured to generate a conversion address by converting an address or an internal address, a memory circuit configured to perform an operation corresponding to the conversion address, and a spare memory circuit configured to store data stored in the memory circuit based on the mode signal, transmit the stored data to the memory circuit while transmitting the internal address to the address converter, and thus store the data in the conversion address of the memory circuit.

In accordance with another aspect of the present disclosure, a semiconductor device includes a mode setting circuit configured to allocate any one value selected from among a plurality of values to a mode signal based on an event signal, wherein the selected value is different from a previous value from among the plurality of values, and an address converter configured to generate different conversion addresses through conversion of a same address, and output any one of the plurality of conversion addresses based on the mode signal.

It is to be understood that both the foregoing general description and the following detailed description of embodiments are exemplary and explanatory.

BRIEF DESCRIPTION OF THE DRAWINGS

The above and other features, and advantages of the present disclosure will become readily apparent by reference to the following detailed description when considered in conjunction with the accompanying drawings wherein.

DESCRIPTION OF EMBODIMENTS

Reference will now be made in detail to certain embodiments, examples of which are illustrated in the accompanying drawings. Prior to description, the terms or words used in the disclosure and the claims are not interpreted as having general meanings or dictionary meanings, but should be interpreted as having meanings and concepts coinciding with the technical scope and sprit of the present disclosure based on the principle that an inventor may properly define the concept of terms to describe the present disclosure in the best mode. Therefore, the embodiments described in the specification and shown in the drawings are purely illustrative and are not intended to represent all aspects of the invention, such that various equivalents and modifications may be made without departing from the spirit of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details.

The drawings are not necessarily to scale and, in some instances, proportions may have been exaggerated in order to clearly illustrate features of the embodiments.

Figure 1:
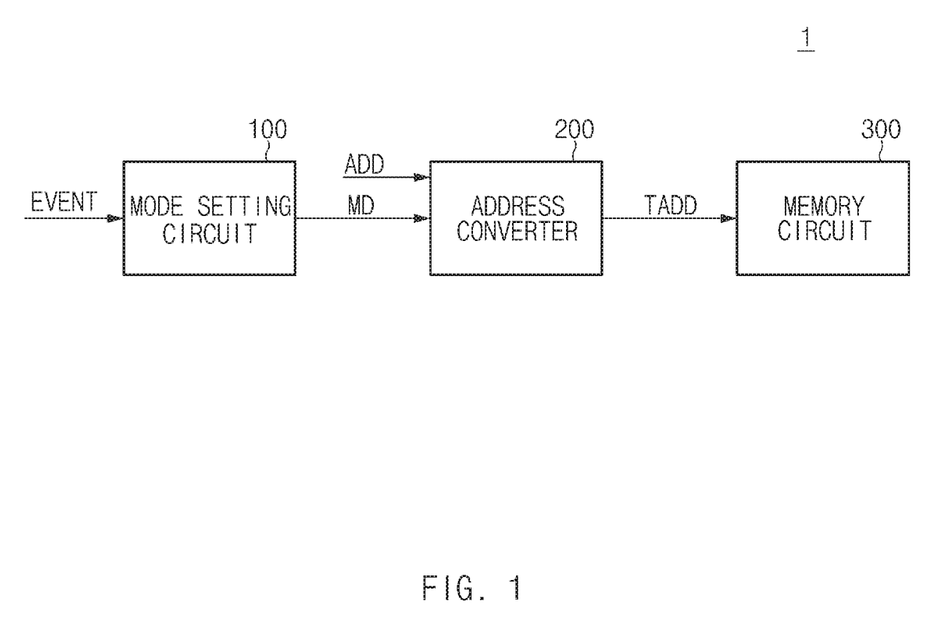
FIG. 1 is a block diagram illustrating an example of a semiconductor device in accordance with an embodiment of the present disclosure.

FIG. 1 is a block diagram illustrating an example of a semiconductor device 1 in accordance with an embodiment of the present disclosure.

Referring to FIG. 1, the semiconductor device 1 may include a mode setting circuit 100, an address converter 200, and a memory circuit 300.

The mode setting circuit 100 may establish or set a mode MD based on an event EVENT. For example, the event EVENT may be any one of a power-ON signal and a power-OFF signal of a system provided with the semiconductor device 1. For example, the event EVENT may be formed in a pulse shape. In accordance with the embodiment, the mode setting circuit 100 may change the mode MD based on the event EVENT.

The address converter 200 may change an address ADD based on the mode MD. The address converter 200 may generate conversion addresses with the address ADD and output one of the conversion addresses as a conversion address TADD based on the mode MD.

The memory circuit 300 may receive the conversion address TADD and perform a necessary operation corresponding to the conversion address TADD. Although not shown in FIG. 1, the memory circuit 300 may receive a command from an external, and may perform a necessary operation corresponding to the received command and the conversion address TADD. The memory circuit 300 may be a volatile memory circuit such as a DRAM or a non-volatile memory circuit such as a Flash memory or phase change memory.

Figure 2:
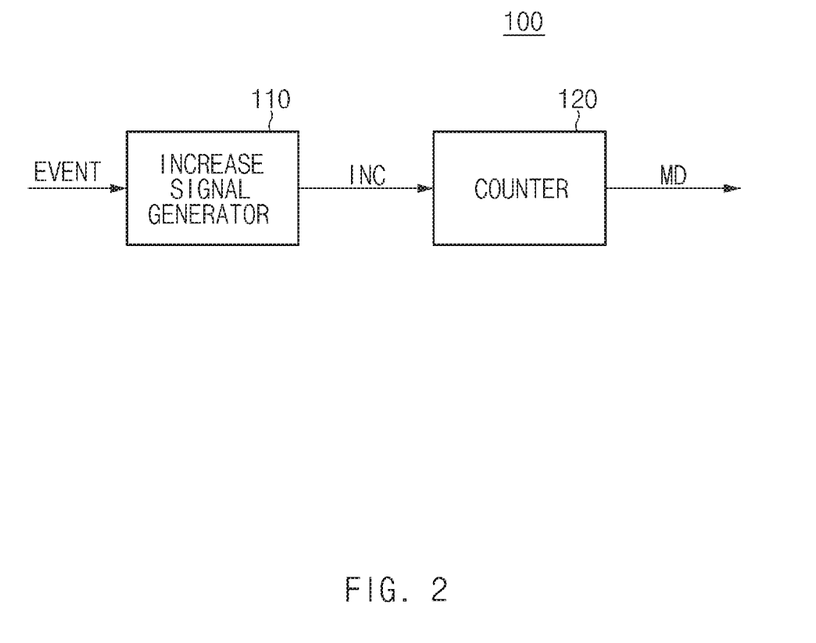
FIG. 2 is a block diagram illustrating an example of the mode setting circuit shown in FIG. 1.

FIG. 2 is a block diagram illustrating the mode setting circuit 100 shown in FIG. 1.

Referring to FIG. 2, the mode setting circuit 100 may include an increase signal generator 110 and a counter 120.

The increase signal generator 110 may generate an increase signal INC based on an event EVENT. The increase signal INC may be formed in a pulse shape.

The counter 120 may increase a value of the mode MD one by one with respect to the increase signal INC. In this embodiment, the counter 120 may sequentially increase the value of the mode MD whenever receiving the increase signal INC. If the counter 120 receives the increase signal INC when the mode MD is set to 3, the value of the mode MD may be set to zero "0". The counter 120 may be a cyclic counter that circulates values (i.e., 0, 1, 2, and 3) in the order of 0→1→2→3. The above-mentioned counter 120 is well known to those skilled in the art, and as such a detailed description thereof will herein be omitted for convenience of description.

Figure 3A:
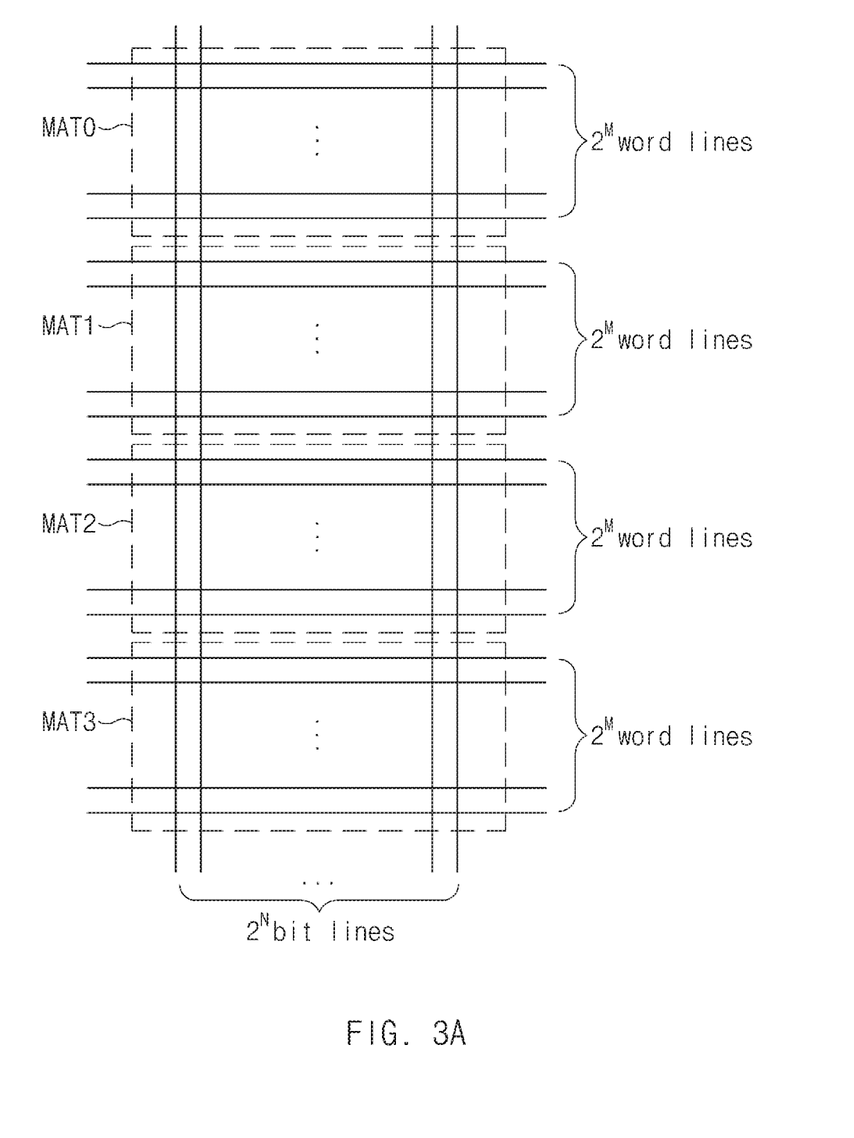
FIG. 3A is a diagram illustrating an example of the memory cell array included in the memory circuit shown in FIG. 1.
Figure 3B:
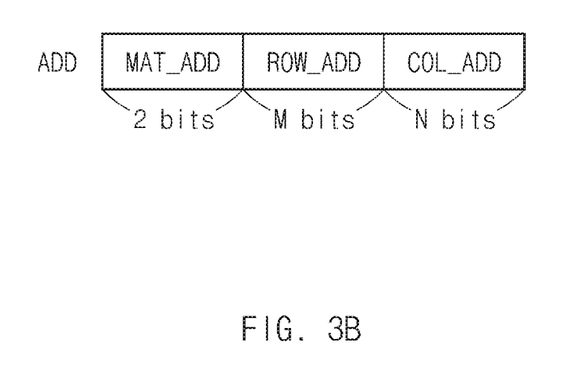
FIG. 3B is a diagram illustrating an example of the address shown in FIG. 1 in accordance with the memory cell array shown in FIG. 3A.

FIG. 3A is a diagram illustrating the memory cell array included in the memory circuit 300 shown in FIG. 1. FIG. 3B is a diagram illustrating the address ADD shown in FIG. 1 according to the memory cell array shown in FIG. 3A.

Referring to FIGS. 3A and 3B, the memory cell array of the memory circuit 300 may include a plurality of word lines extending in a horizontal direction and a plurality of bit lines extending in a vertical direction. The memory cell array may be arranged at intersection points of the word lines and the bit lines.

A mat may refer to a group of a plurality of word lines. It is assumed that the memory cell array includes four mats MAT0~MAT3, each mat includes $2^M$ word lines, and the memory cell array includes $2^N$ bit lines.

Referring to FIG. 3B, the address ADD may include a mat address MAT_ADD, a row address ROW_ADD, and a column address COL_ADD. The memory cell array includes 4 mats, such that the mat address MAT_ADD may include 2 bits. Therefore, if the mat address MAT_ADD is set to "00", this means a mat MAT0. If the mat address MAT_ADD is set to "01", this means a mat MAT1. If the mat address MAT_ADD is set to "10", this means a mat MAT2. If the mat address MAT_ADD is set to "11", this means a mat MAT3.

Since each of the mats MAT0~MAT3 includes $2^M$ word lines, a row address ROW_ADD indicating words lines included in each mat may include M bits. Since the memory cell array may include $2^N$ bit lines, a column address COL_ADD may include N bits.

Figure 4:
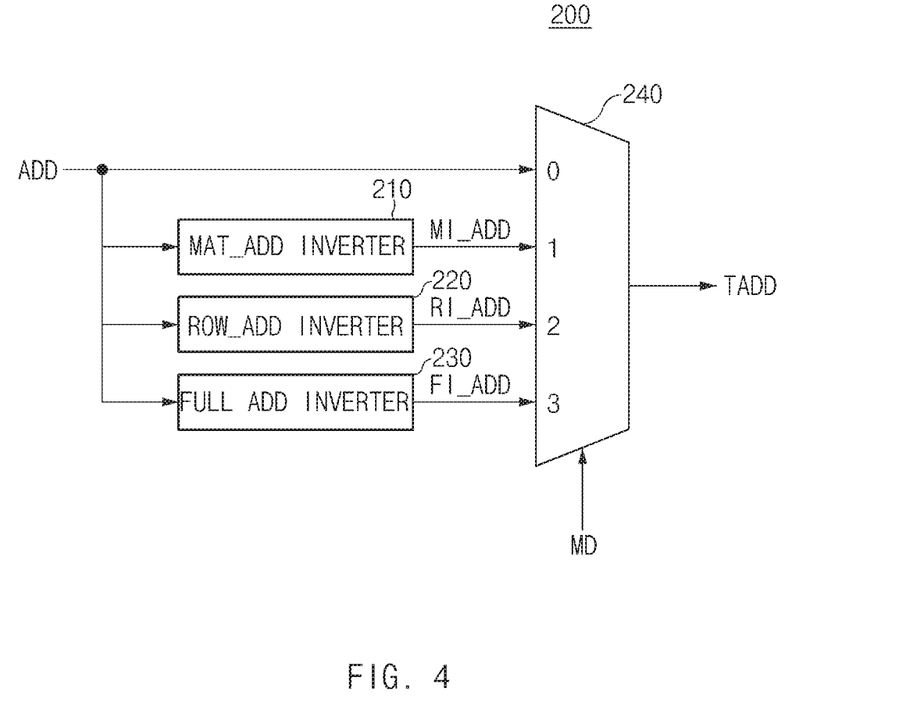
FIG. 4 is a diagram illustrating an example of the address converter shown in FIG. 1.

FIG. 4 is a diagram illustrating the address converter 200 shown in FIG. 1. In FIG. 4, it is assumed that the mode MD may include values 0~3.

Referring to FIG. 4, the address converter 200 may include a mat address inverter 210, a row address inverter 220, a full address inverter 230, and an address selector 240.

The mat address inverter 210 may invert the mat address MAT_ADD from among the addresses ADD, and may thus generate a mat inversion address MI_ADD.

The row address inverter 220 may invert the row address ROW_ADD from among the addresses ADD, and may thus generate a row inversion address RI_ADD.

The full address inverter 230 may invert the entirety of the address ADD, and may thus generate a full inversion address FI_ADD.

The address selector 240 may select any one among the address ADD, the mat inversion address MI_ADD, the row inversion address RI_ADD, and a full inversion address FI_ADD as a conversion address TADD based on the mode MD. In accordance with this embodiment, when the mode MD is set to "0", the address selector 240 may output the address ADD. When the mode MD is set to "1", the address selector 240 may output the mat inversion address MI_ADD. When the mode MD is set to 2, the address selector 240 may output the row inversion address RI_ADD. When the mode MD is set to 3, the address selector 240 may output the full inversion address FI_ADD.

Although FIG. 4 has exemplarily disclosed one example of the address converter 200, the scope or spirit of the present disclosure is not limited thereto. The address converter 200 may include a plurality of sub address converters capable of outputting different results through conversion of the same address ADD, and must generate any one of output signals of the plurality of sub address converters as the conversion address TADD based on the mode MD. For example, the address converter 200 shown in FIG. 4 may include not only the sub address converter (including the mat address inverter 210, the row address inverter 220, and the full address inverter 230) shown in FIG. 1, but also the other sub address converter for adding a predetermined value to the address ADD.

In accordance with the embodiment, since the address converter can perform conversion of the address ADD in a manner that the address ADD has a conversion address TADD that is changed whenever the event EVENT occurs, some regions of the memory circuit 300 are prevented from being intensively accessed, resulting in guarantee of high reliability of the memory circuit 300.

Figure 5:
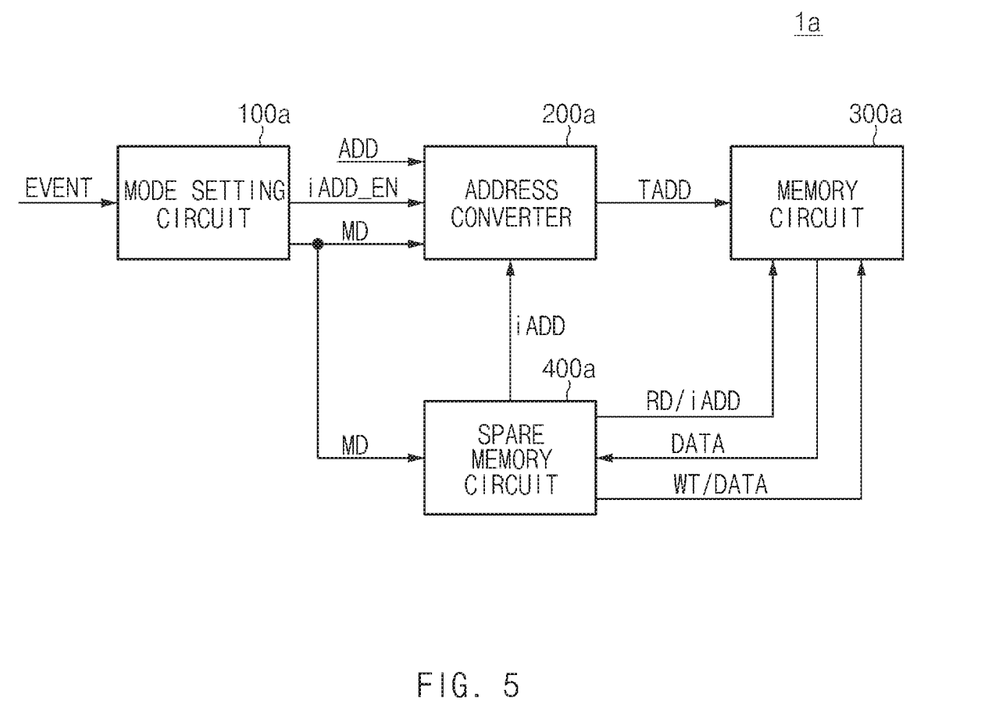
FIG. 5 is a block diagram illustrating an example of a semiconductor device in accordance with an embodiment of the present disclosure.

FIG. 5 is a block diagram illustrating a semiconductor device 1a in accordance with an embodiment of the present disclosure.

Referring to FIG. 5, the semiconductor device 1a may include a mode setting circuit 100a, an address converter 200a, a memory circuit 300a, and a spare memory circuit 400a.

The mode setting circuit 100a may establish or set a mode MD based on an event EVENT, and at the same time may enable an internal address selection signal iADD_EN based on the event EVENT. The event EVENT may be formed in a pulse shape. For example, the internal address selection signal iADD_EN may be enabled during a sufficiently long time in which a spare memory circuit 400a to be described later can transmit the entirety of an internal address iADD.

For example, the event EVENT may be a standby signal of a system provided with the semiconductor device 1a. For example, the standby signal may indicate that a gearshift lever of a vehicle including the semiconductor 1a is located at a neutral mode (N). In this case, any one of a volatile memory circuit and a non-volatile memory circuit may be used as a memory circuit 300a. Upon receiving the event EVENT indicating the standby signal, the mode setting circuit 100a may establish or set the mode MD, and may enable the internal address selection signal iADD_EN.

In accordance with the embodiment, the event EVENT may be any one of a power-ON signals and a power-OFF signal. For example, power-ON signal indicates a first signal indicating that engine ignition of the vehicle is powered on and power-OFF signal indicates a second signal indicating that engine ignition of the vehicle is powered off. Upon receiving the event EVENT indicating any one of the power-ON signal and the power-OFF signal, the mode setting circuit 100a may establish the mode MD. If the memory circuit 300a is a non-volatile memory circuit, the mode setting circuit 100a may enable the internal address selection signal iADD_EN. If the memory circuit 300a is a volatile memory circuit, the mode setting circuit 100a may disable the internal address selection signal iADD_EN.

The address converter 200a may convert the address ADD or the internal address iADD based on the mode MD and the internal address selection signal iADD_EN. For example, during disabling of the internal address selection signal iADD_EN, the address converter 200a may perform conversion of the address ADD based on the mode MD, thereby generating the conversion address TADD. During enabling of the internal address selection signal iADD_EN, the address converter 200a may perform conversion of the internal address iADD based on the mode MD, thereby generating the conversion address TADD. The internal address iADD, like the address ADD, may include a mat address MAT_ADD, a row address ROW_ADD, and a column address COL_ADD.

The memory circuit 300a may receive the conversion address TADD, and may perform a necessary operation based on the received address TADD. In accordance with this embodiment, the memory circuit 300a may perform a read operation based on a read command RD and an internal address iADD that are received from the spare memory circuit 400a, such that the memory circuit 300a may output stored data DATA. In addition, the memory circuit 300a may perform a write operation based on not only a write command WT and data DATA received from the spare memory circuit 400a, but also the conversion address TADD received from the address converter 200a.

The spare memory circuit 400a may output the read command RD and a sequentially-increasing internal address iADD to the memory circuit 300a. Therefore, data DATA received from the memory circuit 300a may be stored in the spare memory circuit 400a. The spare memory circuit 400a may transmit the write command WT and the stored data DATA to the memory circuit 300a, and may sequentially increase the internal address iADD and output the increased internal address iADD to the address converter 200a. In this case, the data DATA may correspond to the internal address iADD. The address converter 200a may convert the internal address iADD based on the mode MD, and may thus generate the conversion address TADD. Therefore, the memory circuit 300a may store data DATA received from the spare memory circuit 400a in the conversion address TADD received from the address converter 200a. That is, after the data DATA stored in the memory circuit 300a is temporarily stored in the spare memory circuit 200a, the spare memory circuit 400a may store the data DATA in the conversion address TADD of the memory circuit 300a.

Figure 6:
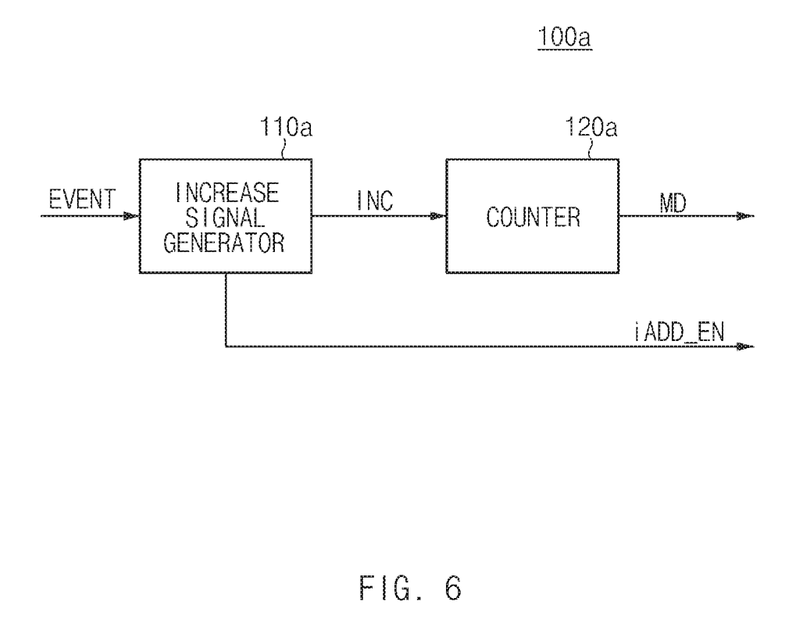
FIG. 6 is a block diagram illustrating an example of the mode setting circuit shown in FIG. 5.

FIG. 6 is a block diagram illustrating the mode setting circuit 100a shown in FIG. 5.

Referring to FIG. 6, the mode setting circuit 100a may include an increase signal generator 110a and a counter 120a.

The increase signal generator 110a may enable an increase signal INC and an internal address selection signal iADD_EN based on the event EVENT. Differently from the increase signal generator 110 of FIG. 1, the increase signal generator 110a of FIG. 6 may enable the internal address selection signal iADD_EN. The counter 120a of FIG. 6 is identical to the counter 120 of FIG. 1, and as such a detailed description thereof will herein be omitted for convenience of description.

Figure 7:
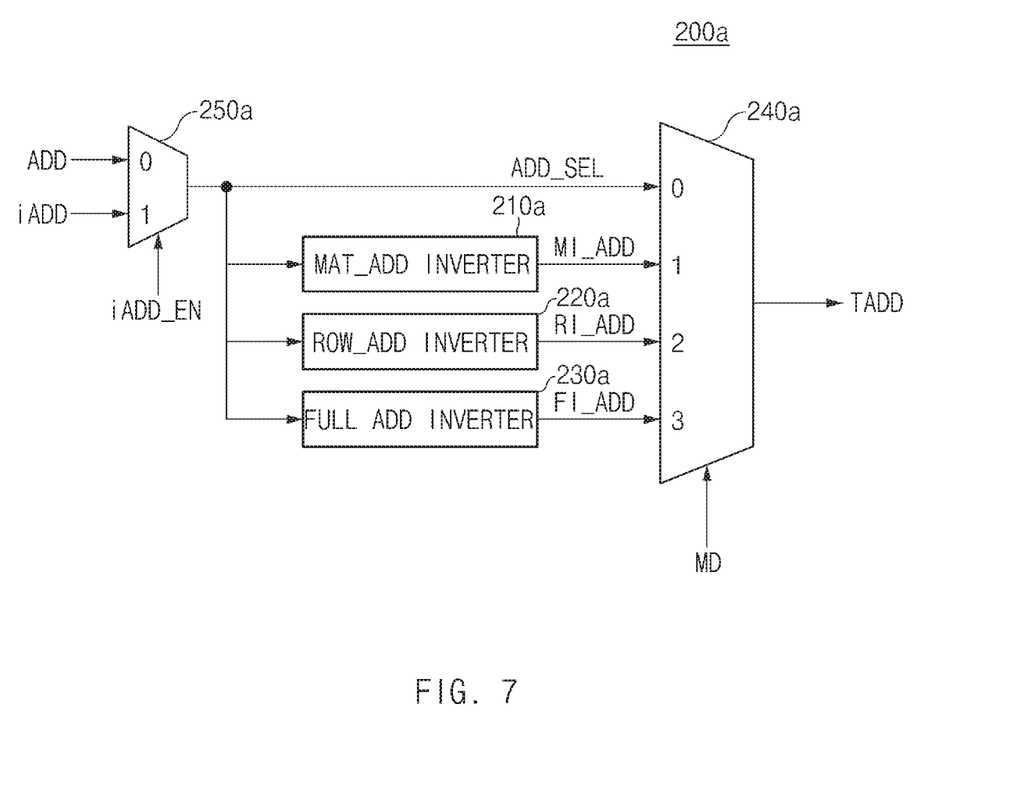
FIG. 7 is a diagram illustrating an example of the address converter shown in FIG. 5.

FIG. 7 is a diagram illustrating the address converter 200a shown in FIG. 5.

Referring to FIG. 7, the address converter 200a may include a mat address inverter 210a, a row address inverter 220a, a full address inverter 230a, an address selector 240a, and an input address selector 250a.

The input address selector 250a may select any one of the address ADD and the internal address iADD based on an internal address enable signal iADD_EN. During enabling of the internal address enable signal iADD_EN, the input address selector 250a may select the internal address iADD, and may output the selected internal address iADD as a selection address ADD_SEL. During disabling of the internal address enable signal iADD_EN, the input address selector 250a may select the address ADD, and may output the selected address ADD as a selection address ADD_SEL.

The mat address inverter 210a, the row address inverter 220a, the full address inverter 230a, and the address selector 240a shown in FIG. 7 may receive the selection address ADD_SEL instead of the address ADD, differently from the mat address inverter 210, the row address inverter 220, the full address inverter 230, and the address selector 240 shown in FIG. 4, the remaining parts other than reception of the selection address ADD_SEL in FIG. 7 are identical in function to those of FIG. 4, and as such a detailed description thereof will herein be omitted for convenience of description.

Although FIG. 7 has exemplarily disclosed one example of the address converter 200a for convenience of description, the scope or spirit of the present disclosure is not limited thereto. In the same manner as in the address converter 200 of FIG. 1, the address converter 200a shown in FIG. 7 may include a plurality of sub address converters capable of outputting different results through conversion of the same selection address ADD_SEL, and must generate any one of the output signals of the sub address converters as the conversion address TADD based on the mode MD.

Figure 8:
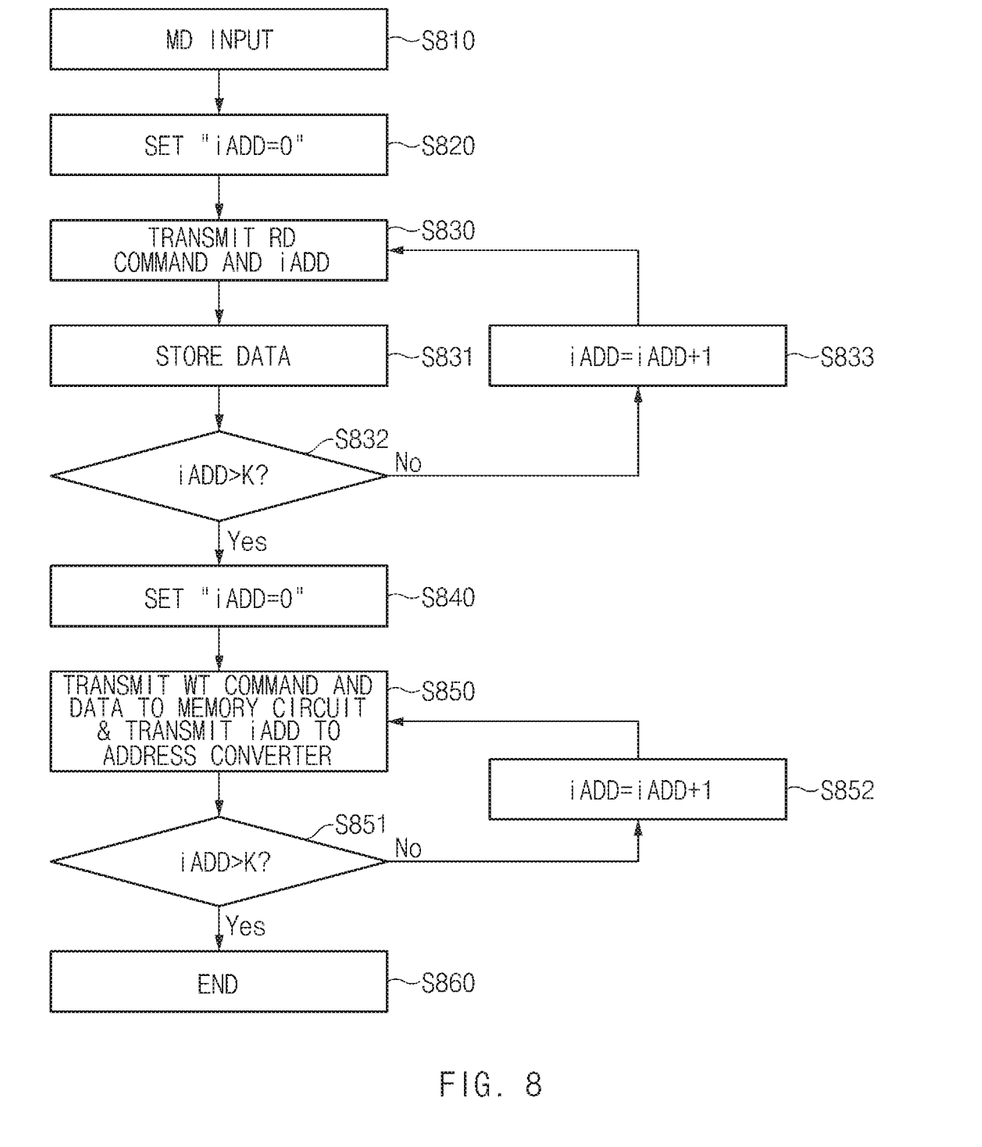
FIG. 8 is a flowchart illustrating operations of the spare memory circuit shown in FIG. 5.

FIG. 8 is a flowchart illustrating operations of the spare memory circuit 400a shown in FIG. 5.

Referring to FIG. 8, the spare memory circuit 400a may initialize the internal address iADD (S820) upon receiving the mode MD (S810). An initial value of the internal address iADD may be set to zero "0".

The spare memory circuit 400a may transmit not only the read command RD but also the internal address iADD set to zero "0" to the memory circuit 300a (S830). Accordingly, the memory circuit 300a may perform a read operation for the internal address iADD set to zero "0", and may thus output data DATA.

The spare memory circuit 400a may store the data DATA received from the memory circuit 300a therein (S831).

The spare memory circuit 400a may determine whether the internal address iADD is higher than a maximum value K of the address capable of being allocated to the memory circuit 300a (S832). Since the internal address iADD is set to zero "0", the spare memory circuit 400a may determine that the internal address iADD having zero "O" is less than the maximum value K (S832, NO).

The spare memory circuit 400a may increase the value of the internal address iADD by one (S833), and may transmit the read command RD and the internal address iADD having the value of 1 to the memory circuit 300a (S830). Therefore, the memory circuit 300a may perform a read operation for the internal address iADD having the value of 1, and may thus output data DATA. The spare memory circuit 400a may store the data DATA received from the memory circuit 300a therein (S831).

As described above, the spare memory circuit 400a may sequentially increase the internal address iADD, and at the same time may read the data DATA stored in the internal address iADD of the memory circuit 300a, thereby storing the data DATA in the spare memory circuit 400a.

If the internal address iADD is higher than the maximum value K of the address capable of being allocated to the memory circuit 300a (S832), i.e., if the entirety of the data DATA stored in the memory circuit 300a is completely read, the spare memory circuit 400a may set the internal address iADD to zero "0" (S840).

The spare memory circuit 400a may transmit not only the write command WT, but also the data DATA corresponding to the internal address iADD to the memory circuit 300a, and at the same time may transmit the internal address iADD to the address converter 200a (S850). In this case, since the internal address enable signal iADD_EN is enabled, the address converter 200a may convert the internal address iADD received from the spare memory circuit 400a based on the mode MD, may generate the conversion address TADD, and may transmit the generated conversion address TADD to the memory circuit 300a. The memory circuit 300a may perform a write operation, upon receiving not only the write command WT and the data DATA received from the spare memory circuit 400a, but also the conversion address TADD received from the address converter 200a.

Since the internal address iADD is set to zero "0", the spare memory circuit 400a may determine that the internal address iADD having zero "0" is not higher than the maximum value K of the address capable of being allocated to the memory circuit 300a (S851, NO).

The spare memory circuit 400a may sequentially increase the internal address iADD (S852), may transmit not only the write command WT, but also the data DATA corresponding to the increased internal address iADD to the memory circuit 300a, and at the same time may transmit the internal address iADD to the address converter 200a (S850). Therefore, the data DATA may be stored in the conversion address TADD of the memory circuit 300a.

If the internal address iADD is higher than the maximum value K (S851, YES), this means that the entirety of data DATA stored in the spare memory circuit 400a is stored in the conversion address TADD of the memory circuit 300a, such that processing is ended (S860). Thereafter, the mode setting circuit 100a may disable the internal address enable signal iADD_EN, and the address converter 200a may perform conversion of the address ADD.

In accordance with the embodiment, although the semiconductor device 1a receives the event EVENT of the standby signal as an input, the semiconductor device 1a may also perform address conversion. Therefore, even when the system provided with the semiconductor device 1a is continuously powered on, the semiconductor device 1a may change the address of the memory circuit 300a to another address so as to prevent some regions of the memory circuit 300a from being intensively accessed, resulting in high reliability of the memory circuit 300a.

As is apparent from the above description, the semiconductor device in accordance with the embodiments of the present disclosure may increase reliability of a memory circuit by reducing the number of intensive access times of some regions of a memory circuit.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
a mode setting circuit configured to allocate any one of values to a mode signal based on an event signal;
an address converter configured to generate a conversion address by converting at least one address based on the mode signal; and
a memory circuit configured to perform an operation corresponding to the conversion address,
wherein the mode setting circuit includes:
an increase signal generator configured to generate an increase signal based on the event signal; and
a counter configured to increase a value of the mode signal based on the increase signal.

2. The semiconductor device according to claim 1, wherein the address converter includes:
a plurality of sub address converters configured to correspond to the plurality of values, and have different conversion results of the address.

3. The semiconductor device according to claim 2, further comprising:
an address selector configured to select any one of output signals of the plurality of sub address converters as the conversion address.

4. The semiconductor device according to claim 1, wherein the address converter includes:
a mat address inverter configured to generate a mat inversion address by inverting a mat address from among the at least one address;
a row address inverter configured to generate a row inversion address by inverting a row address from among the at least one address; and
a full address inverter configured to generate a full inversion address by inverting the at least one address.

5. The semiconductor device according to claim 1, further comprising:
a spare memory circuit configured to store data stored in the memory circuit based on the mode signal, transmit an internal address to the address converter, and transmit a write command and the stored data corresponding to the internal address to the memory circuit.

6. The semiconductor device according to claim 5, wherein the mode setting circuit is configured to generate an internal address enable signal based on the event signal.

7. The semiconductor device according to claim 6, wherein the address converter selects any one of the address and the internal address based on the internal address enable signal, and performs conversion of the selected address.

8. The semiconductor device according to claim 5, wherein the event signal is a standby signal.

9. The semiconductor device according to claim 8, wherein:
the semiconductor device is mounted to a vehicle; and
the event signal indicates that a gearshift lever of the vehicle is located at a neutral mode.

10. The semiconductor device according to claim 1, wherein the event signal is any one of a power-ON signal and a power-OFF signal.

11. The semiconductor device according to claim 10, wherein:
the semiconductor device is mounted to a vehicle; and
the event signal indicates any one of a first signal indicating that engine ignition is powered on and a second signal indicating that engine ignition is powered off.

12. The semiconductor device according to claim 1, wherein the counter includes a cyclic counter that sequentially increases the value of the mode signal from initial value to final value, and returns the value of the mode signal to the initial value when the value of the mode signal reaches the final value.

13. A semiconductor device comprising:
a mode setting circuit configured to allocate any one of a plurality of values to a mode signal based on an event signal;
an address converter configured to generate a conversion address by converting an address or an internal address;
a memory circuit configured to perform an operation corresponding to the conversion address; and
a spare memory circuit configured to store data stored in the memory circuit based on the mode signal, transmit the stored data to the memory circuit while transmitting the internal address to the address converter, and thus store the data in the conversion address of the memory circuit.

14. The semiconductor device according to claim 13, wherein the spare memory circuit transmits the internal address and a read command to the memory circuit, and thus receives the data stored in the memory circuit.

15. The semiconductor device according to claim 13, wherein the spare memory circuit transmits the internal address to the address converter, transmits not only the stored data corresponding to the internal address but also a write command to the memory circuit, and stores the data in the conversion address of the memory circuit.

16. The semiconductor device according to claim 13, wherein the event signal is a standby signal.

17. The semiconductor device according to claim 13, wherein:
the event signal is any one of a power-ON signal and a power-OFF signal; and
the memory circuit is a non-volatile memory circuit.

18. A semiconductor device comprising:
a mode setting circuit configured to allocate any one value selected from among a plurality of values to a mode signal based on an event signal, wherein the selected value is different from a previous value from among the plurality of values; and
an address converter configured to generate different conversion addresses through conversion of a same address, and output any one of the plurality of conversion addresses based on the mode signal,
wherein the mode setting circuit includes:
an increase signal generator configured to generate an increase signal based on the event signal; and
a counter configured to increase a value of the mode signal based on the increase signal.

19. The semiconductor device according to claim 18, wherein the address converter includes:

a mat address inverter configured to generate a mat inversion address by inverting a mat address from the same address;

a row address inverter configured to generate a row inversion address by inverting a row address from the same address; and a full address inverter configured to generate a full inversion address by inverting the same address, whereby the address converter outputs any one of the address, the mat inversion address, the row inversion address, and the full inversion address based on the mode signal.

20. The semiconductor device according to claim 18, wherein the counter includes a cyclic counter that sequentially increases the value of the mode signal from initial value to final value, and returns the value of the mode signal to the initial value when the value of the mode signal reaches the final value.

\* \* \* \* \*